United States Patent
Campos

(10) Patent No.: US 11,107,742 B2
(45) Date of Patent: Aug. 31, 2021

(54) ELECTRONIC DEVICES AND FABRICATING PROCESSES

(71) Applicant: STMicroelectronics (Grenoble 2) SAS, Grenoble (FR)

(72) Inventor: Didier Campos, Charavines (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/295,132

(22) Filed: Mar. 7, 2019

(65) Prior Publication Data
US 2019/0287874 A1   Sep. 19, 2019

(30) Foreign Application Priority Data

Mar. 13, 2018 (FR) ........................... 1852157

(51) Int. Cl.
| | | |
|---|---|---|
| *H01L 23/31* | (2006.01) | |
| *H01L 21/56* | (2006.01) | |
| *H01L 23/00* | (2006.01) | |
| *H01L 23/36* | (2006.01) | |
| H01L 23/498 | (2006.01) | |
| H01L 23/373 | (2006.01) | |

(52) U.S. Cl.
CPC ........ *H01L 23/3128* (2013.01); *H01L 21/565* (2013.01); *H01L 23/315* (2013.01); *H01L 23/36* (2013.01); *H01L 24/09* (2013.01); *H01L 24/17* (2013.01); *H01L 24/32* (2013.01); *H01L 24/73* (2013.01); *H01L 23/373* (2013.01); *H01L 23/49816* (2013.01); *H01L 23/49822* (2013.01); *H01L 2224/73204* (2013.01)

(58) Field of Classification Search
CPC ............. H01L 23/373; H01L 2023/405; H01L 2023/407; H01L 21/4878; H01L 21/52; H01L 31/0203; H01L 23/36; H01L 23/315; H01L 25/168; H01L 23/3128; H01L 24/09; H01L 24/17; H01L 24/73; H01L 21/565; H01L 21/566; H01L 21/568; H01L 24/32; H01L 2224/73204
See application file for complete search history.

(56) References Cited

U.S. PATENT DOCUMENTS

| | | | |
|---|---|---|---|
| 9,953,957 B2* | 4/2018 | Gao | ......................... H01L 24/83 |
| 2008/0150065 A1* | 6/2008 | Oda | .................... H01L 31/0203 |
| | | | 257/434 |

(Continued)

FOREIGN PATENT DOCUMENTS

WO     2015026704 A1    2/2015

OTHER PUBLICATIONS

INPI Search Report and Written Opinion for FR 1852157 dated Oct. 31, 2018 (8 pages).

*Primary Examiner* — Latanya N Crawford Eason
(74) *Attorney, Agent, or Firm* — Crowe & Dunlevy

(57) ABSTRACT

An electronic device includes a carrier wafer having a front side and a back side, with an electrical connection network configured to connect the front side to the back side. An electronic chip is mounted on the front side of the carrier wafer and electrically connected to front pads of the electrical connection network. A sheet of a thermally conductive graphite or a pyrolytic graphite is added to the back side of the carrier wafer. The sheet includes apertures which leave back pads of the electrical connection network uncovered.

6 Claims, 2 Drawing Sheets

(56) References Cited

U.S. PATENT DOCUMENTS

| | | |
|---|---|---|
| 2009/0045505 A1 | 2/2009 | Hsu |
| 2013/0075887 A1 | 3/2013 | Suzuki |
| 2016/0104656 A1 | 4/2016 | Luan |
| 2016/0181169 A1* | 6/2016 | Huang .................... H01L 25/50 257/772 |
| 2016/0260687 A1* | 9/2016 | Gao ........................ H01L 24/17 |
| 2016/0351549 A1* | 12/2016 | Lin ......................... H01L 24/20 |
| 2018/0197821 A1* | 7/2018 | Shin .................... H01L 23/3128 |

* cited by examiner

ELECTRONIC DEVICES AND FABRICATING PROCESSES

PRIORITY CLAIM

This application claims the priority benefit of French Application for Patent No. 1852157, filed on Mar. 13, 2018, the content of which is hereby incorporated by reference in its entirety to the maximum extent allowable by law.

TECHNICAL FIELD

The present invention relates to the field of microelectronics and more particularly the field of electronic devices including electronic chips that are liable to produce heat.

SUMMARY

According to one embodiment, an electronic device is provided that comprises: a carrier wafer having a mounting front side and a back side and provided with an electrical connection network that connects one side to the other; at least one electronic chip that is mounted on the mounting front side of the carrier wafer and that is electrically connected to front pads of the electrical connection network; and at least one sheet of a thermally conductive material, which is added to the back side of the carrier wafer and that has apertures that leave uncovered back pads of the electrical connection network.

Said thermally conductive sheet may be made of a supple or flexible material.

Said thermally conductive sheet may be made of metal or of graphite or of pyrolytic graphite (PGS).

Said thermally conductive sheet may be added by way of an adhesive layer.

Said adhesive layer may be made of a thermally conductive material.

Exterior electrical connection elements may be placed on the back pads of the electrical connection network, through and at a distance from the edges of the apertures of said thermally conductive sheet.

According to one variant embodiment, an encapsulating cover may be mounted on the front side of the carrier wafer and may define a cavity in which the chip is located.

According to one variant embodiment, the chip may be at least partially embedded in an encapsulating block provided on the front side of the carrier wafer.

A process for fabricating an electronic device comprises the following steps: providing a carrier wafer having a mounting front side and a back side, said wafer being provided with an electrical connection network that connects one side to the other and being equipped with at least one electronic chip that is mounted on the mounting front side of the carrier wafer and that is electrically connected to front pads of the electrical connection network; adhesively bonding a sheet made of thermally conductive material to the back side of the carrier wafer; and producing apertures through the thermally conductive sheet, so as to leave at least partially uncovered back pads of the electrical connection network.

Said carrier wafer may be, beforehand, on the front side, equipped with an encapsulating cover that defines a chamber in which the chip is located, or equipped with an encapsulating block in which the chip is embedded.

The process may comprise the following steps: placing the thermally conductive sheet on a face of a first portion of a mold; placing the back side of the carrier wafer on the thermally conductive sheet, with interposition of an adhesive layer; placing a second portion of the mold on the first portion of the mold, so as to form a cavity above the front side of the carrier wafer, in which cavity the chip is located; injecting, under pressure, a coating material into said cavity, so as to form an encapsulating block in which the chip is at least partially embedded; and, after extraction from the mold, producing said apertures.

The process may comprise the following step: placing electrical connection elements on the back pads, through and at a distance from the edges of the apertures of the thermally conductive sheet.

The process may comprise: choosing the thermally conductive sheet from a metal sheet or a sheet made of graphite-based material or of pyrolytic graphite (PGS).

The process may comprise: choosing the material of the adhesive layer to be a thermally conductive material.

BRIEF DESCRIPTION OF THE DRAWINGS

Electronic devices and fabricating processes will now be described by way of example, said devices and processes being illustrated by the appended drawings, in which.

DETAILED DESCRIPTION

Figure 1:
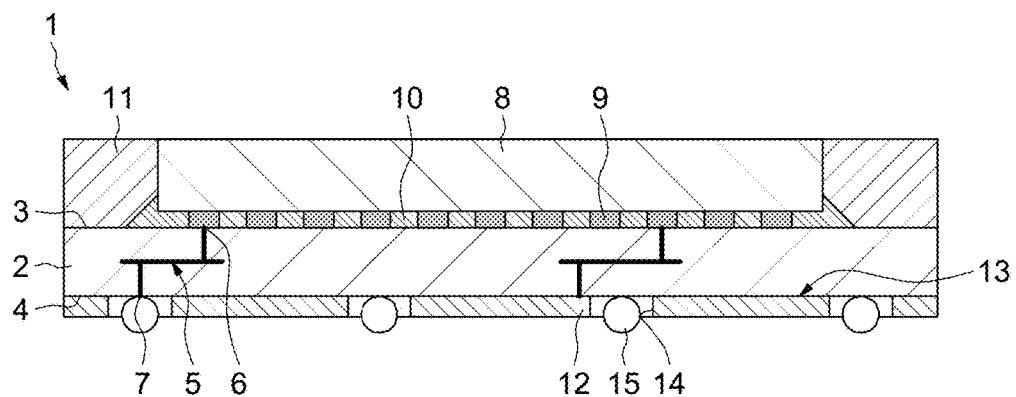
FIG. 1 shows a cross section through an electronic device.

FIG. 1 illustrates an electronic device 1, or electronic package, that comprises a carrier wafer 2 that has a front side 3 and a back side 4 and that is provided with an electrical connection integrated network 5 that connects the front side to the back side and that selectively establishes electrical links between front pads 6 and back pads 7.

The electronic device 1 comprises an electronic chip 8 that is mounted on the front side 3 by way of electrical connection elements 9, which furthermore electrically connect the chip 8 to the front pads 6 of the electrical connection network 5.

The electronic device 1 comprises a dielectric local intermediate layer 10, between the front side 3 of the carrier wafer 2 and the chip 8, in which layer the electrical connection elements 9 are embedded, and a dielectric encapsulating block 11 on the front side 3 of the carrier wafer 2 and in which the chip 8 is, at least partially, embedded. The dielectric local intermediate layer 10 and the dielectric encapsulating block 11 are, for example, respectively made of an epoxy resin.

The electronic device 1 comprises a sheet 12 of a thermally conductive material, which sheet is added to the back side 4 of the carrier wafer 2 and fastened in place by way of an adhesive layer 13 forming a bonding interface. Advantageously, the adhesive layer 13 may be made of a thermally conductive material.

The thermally conductive sheet 12 contains apertures 14 that leave uncovered the back pads 7 of the electrical connection network 5, so that there is no electrical contact between the thermally conductive sheet 12 and the back pads 7.

The electronic device 1 furthermore comprises exterior electrical connection elements 15, for example metal balls, which are placed on and soldered to the back pads 7 of the electrical connection network 5, through and at a distance from the edges of the apertures 14 of the thermally conductive sheet 12.

Advantageously, the electrical connection elements 15 are thicker than the thickness of the thermally conductive layer 12 and thus jut out beyond the exposed surface of the sheet 12.

The electronic device 1 is configured to be mounted on a printed circuit board (not shown) by way of the electrical connection elements 15.

The apertures 14 are dimensioned so as to prevent any electrical contact between the thermally conductive sheet 12 and the electrical connection elements 15.

Advantageously, the thermally conductive sheet 12 is made of a supple or flexible material, for example a metal or of graphite or of pyrolytic graphite (PGS).

By virtue of the existence of the thermally conductive sheet 12, the heat produced by the chip 8 is more easily removed via diffusion through the material from one side to the other. In addition, the heat produced locally by the chip 8 diffuses through the material substantially parallel to the sides of the sheet 12, in particular when the sheet 12 is made of pyrolytic graphite (PGS), thus facilitating the removal of the locally produced heat and preventing the temperature of the chip 8 from getting too high locally.

The electronic device 1 may be fabricated individually in the following way.

An apertureless thermally conductive sheet 12 is gradually spread over and pressed against the back side 4 of the carrier wafer 2, with interposition beforehand of a wafer-scale adhesive layer 13 on the wafer-scale sheet 12 and/or on the back side of the carrier wafer 2.

Next, the apertures 14 are produced, for example under the effect of laser radiation, and the electrical connection elements 15 are placed in the apertures 14 on the back pads 7 of the electrical connection networks 5.

The electronic device 1 may be obtained via a first wafer-scale fabricating process, in the following way.

Figure 2:
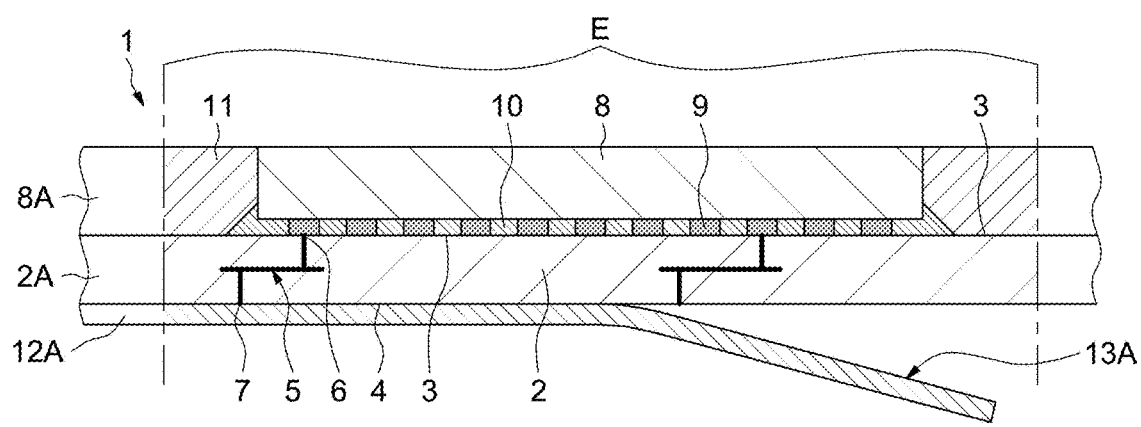
FIG. 2 shows, in cross section, a wafer-scale-processed electronic device in a step of one fabricating process.

As illustrated in FIG. 2, a wafer-scale-processed carrier wafer 2A is provided, in adjacent locations E, with electrical connection networks 5.

Chips 8 are mounted on a front side of the wafer-scale-processed carrier wafer 2A, in the locations E.

The chips 8 are embedded in a wafer-scale encapsulating block 8A.

An apertureless wafer-scale thermally conductive sheet 12A is, gradually, spread over and pressed against the back side of the wafer-scale-processed carrier wafer 2A, with interposition beforehand of a wafer-scale adhesive layer 13A on the wafer-scale sheet 12A and/or on the back side of the wafer-scale-processed carrier wafer 2A.

Figure 3:
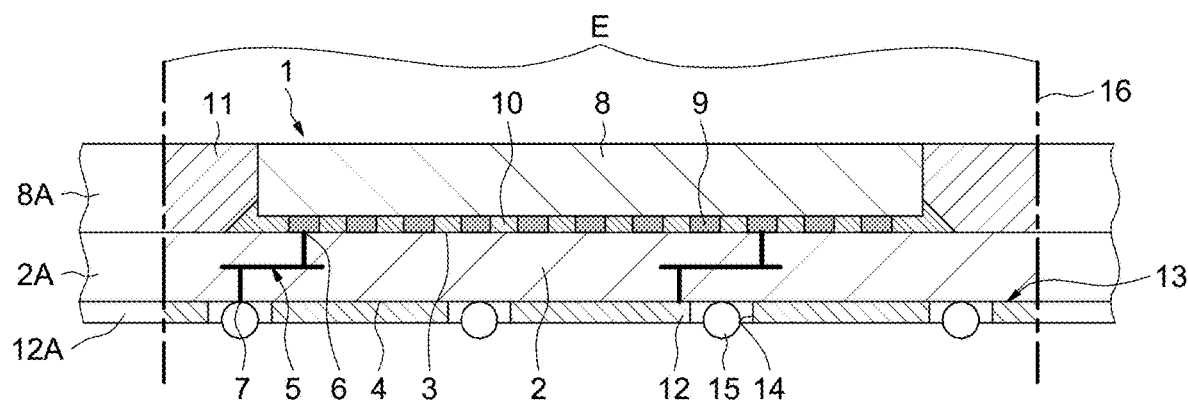
FIG. 3 shows, in cross section, the wafer-scale-processed electronic device of FIG. 2, in another fabricating step.

Next, as illustrated in FIG. 3, in each location E, apertures 14 are produced through the wafer-scale sheet 12A, for example under the effect of laser radiation, and electrical connection elements 15 are placed in the apertures 14 on the back pads 7 of the electrical connection networks 5.

Lastly, a dicing operation, for example a sawing operation, is carried out along transverse and longitudinal lines 16 separating the locations E, through the wafer-scale-processed carrier wafer 2A, the wafer-scale encapsulating block 8A and the wafer-scale thermally conductive sheet 12A, so as to obtain a plurality of singulated electronic devices 1.

The electronic device 1 may be obtained via a second wafer-scale fabricating process, in the following way.

Figure 4:
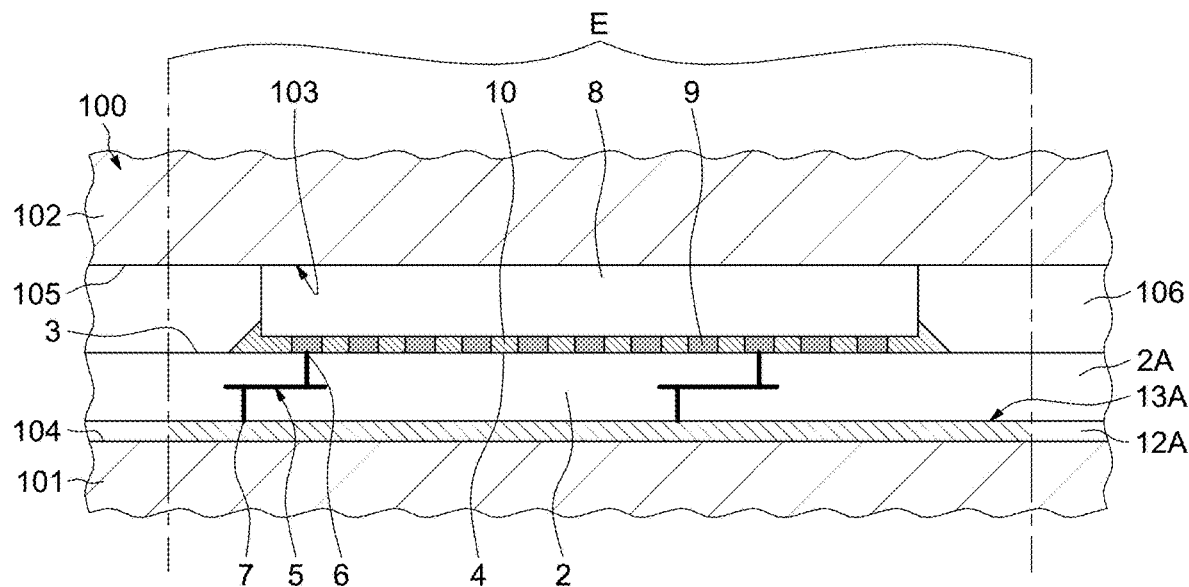
FIG. 4 shows, in cross section, a wafer-scale-processed electronic device in a step of another fabricating process.

As illustrated in FIG. 4, a mold 100 is provided, which mold comprises a lower portion 101 and an upper portion 102 that, in the mated position, define therebetween an empty space 103 between a face 104 of the lower portion 101 and a face 105 of the upper portion 102, the faces 104 and 105 being opposite and parallel.

A wafer-scale-processed carrier wafer 2A is provided, which wafer is provided, in adjacent locations E, with electrical connection networks 5 and equipped, in the locations E, with chips 8.

The mold 100 being open, the following operations are carried out.

An apertureless wafer-scale thermally conductive sheet 12A is placed on the face 104 of the first portion 101 of the mold 100.

The back side of the wafer-scale-processed carrier wafer 2A, i.e. the side located opposite the chips 8, is placed on the thermally conductive sheet, with interposition of a wafer-scale adhesive layer 13, this layer being added beforehand to the wafer-scale sheet 12A and/or to the wafer-scale-processed carrier wafer 2A.

The mold 100 is closed by placing the second portion 102 on the first portion 101, so as to define a cavity 106 above the wafer-scale-processed carrier wafer 2A and around the chips 8. For example, the face 105 of the second portion 102 of the mold 100 bears against the front sides of the chips 8 so that the cavity 106 is formed around the chips 8.

Next, a coating material is injected, under pressure, into the cavity, so as to form a wafer-scale encapsulating block 8A in which the chips are at least partially embedded. The injection pressure generates a pressure that presses the wafer-scale-processed carrier wafer 2A against the wafer-scale sheet 12A, facilitating the bonding by way of the adhesive layer 13A.

After extraction of the mold, the operations described above with reference to FIG. 3 are carried out, so as to obtain singulated electronic devices 1.

According to one variant embodiment (not shown), the chip 8 of the electronic device 1 could be connected to the carrier wafer 2 by electrical connection wires connecting front pads of the chip 8 with front pads 6 of the carrier wafer 2. The chip 8 would then be completely embedded in the encapsulating block 11, the latter covering the front side of the chip 8.

In this case, in the second fabricating process, the upper portion 102 of the mold 100 would be placed a distance above the front side of the chips 8 and a distance away from the electrical connection wires.

Figure 5:
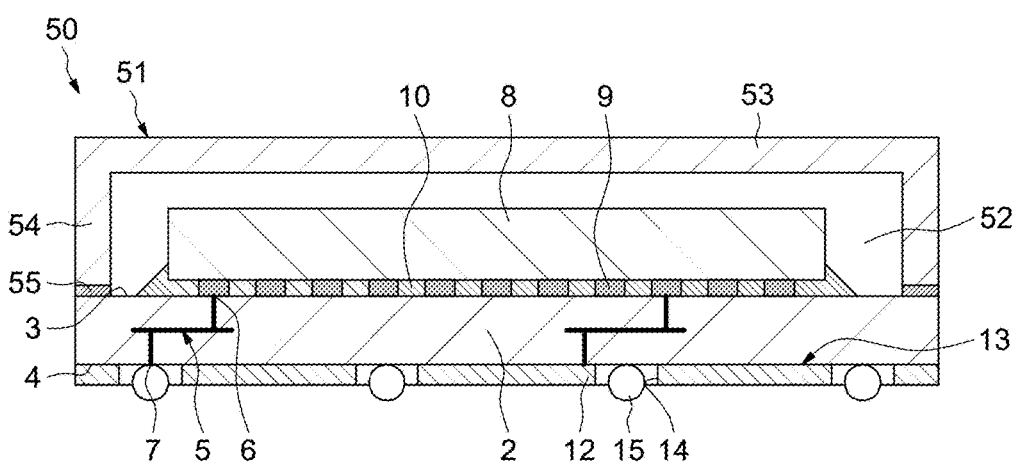
FIG. 5 shows a cross section through another electronic device.

According to one variant embodiment illustrated in FIG. 5, an electronic device 50 differs from the electronic device 1 in that the encapsulating block 11 is replaced by an encapsulating cover 51 that is mounted on the carrier wafer 2 and that defines a chamber 52 in which the chip 8 and the electrical connection elements 9 are located.

The encapsulating cover 51 comprises a front wall 53 that is located above the chip 8 and a back peripheral wall 54 the back edge of which is fastened to the front side 3 of the carrier wafer 2 by way of a bead of adhesive 55.

A plurality of chips could be located in the encapsulating cover 51, optionally in a plurality of chambers defined by this cover.

The electronic device 50 may be obtained via an individual fabrication equivalent to that described above.

The electronic device 50 may also be obtained via a wafer-scale fabrication equivalent to the first wafer-scale fabrication process described above.

In this case, encapsulating covers 51 are mounted in the locations E, at distance from one another, an apertureless wafer-scale thermally conductive sheet 12A is adhesively bonded to the back side of the wafer-scale-processed carrier wafer 2A, apertures 14 are produced in each location E through the wafer-scale sheet 12A and electrical connection elements 15 are placed in the apertures 14 on the back pads 7 of the electrical connection networks 5.

Next, a dicing operation, for example a sawing operation, is carried out along transverse and longitudinal lines separating the locations E, through the wafer-scale-processed carrier wafer 2A and the wafer-scale thermally conductive sheet 12A, between and optionally at distance from the encapsulating covers, so as to obtain a plurality of singulated electronic devices 50.

The invention claimed is:

1. A process for fabricating an electronic device, comprising the following steps:
    providing a carrier wafer having a front side and a back side, said carrier wafer being provided with an electrical connection network that connects the front side to the back side and being equipped with at least one electronic chip that is mounted on the front side of the carrier wafer and that is electrically connected to front electrical pads of the electrical connection network;
    equipping the front side of the carrier wafer with an encapsulating block which embeds the at least one electronic chip;
    adhesively bonding a sheet made of thermally conductive material to the back side of the carrier wafer with the encapsulating block, wherein said thermally conductive material is selected from the group consisting of a graphite or a pyrolytic graphite; and
    producing apertures through the sheet made of thermally conductive material, said apertures leaving back electrical pads of the electrical connection network at least partially uncovered; and
    dicing through the encapsulation block and carrier wafer to singulate the electronic device.

2. The process of claim 1, further comprising placing electrical connection elements on the back pads, said exterior electrical connection elements extending through the apertures and further separated by a distance from edges of the apertures.

3. A process for fabricating an electronic device, comprising the following steps:
    placing a sheet made of thermally conductive material on a face of a first portion of a mold, wherein said thermally conductive material is selected from the group consisting of a graphite or a pyrolytic graphite;
    placing a back side of a carrier wafer on the sheet made of thermally conductive material, with interposition of an adhesive layer, wherein said carrier wafer further includes an electrical connection network that connects a front side to the back side and includes at least one electronic chip mounted on the front side and electrically connected to front electrical pads;
    placing a second portion of the mold on the first portion of the mold, so as to form a cavity above the front side of the carrier wafer, in which cavity the at least one electronic chip is located;
    injecting, under pressure, a coating material into said cavity, so as to form an encapsulating block in which the at least one electronic chip is at least partially embedded; and
    after extraction from the mold, producing apertures through the sheet made of thermally conductive material, said apertures leaving back electrical pads of the electrical connection network at least partially uncovered.

4. The process according to claim 3, wherein the adhesive layer is made of a thermally conductive adhesive material.

5. The process of claim 3, further comprising placing electrical connection elements on the back pads, said exterior electrical connection elements extending through the apertures and further separated by a distance from edges of the apertures.

6. The process of claim 3, further comprising, after extraction from the mold, dicing through the encapsulation block and carrier wafer to singulate the electronic device.

* * * * *